United States Patent [19]

Kimura et al.

[11] Patent Number: 5,614,425

[45] Date of Patent: Mar. 25, 1997

[54] METHOD OF FABRICATING A BIPOLAR TRANSISTOR OPERABLE AT HIGH SPEED

[75] Inventors: Koji Kimura, Chigasaki; Hiroshi Naruse, Yokohama, both of Japan

[73] Assignee: Kabushiki Kaisha Toshiba, Kawasaki, Japan

[21] Appl. No.: 622,270

[22] Filed: Mar. 27, 1996

[30] Foreign Application Priority Data

Mar. 31, 1995 [JP] Japan .................................. 7-074882

[51] Int. Cl.$^6$ .................................................. H01L 21/265
[52] U.S. Cl. .................................. 437/31; 437/89; 437/99; 437/162; 437/200; 148/DIG. 163
[58] Field of Search ........................ 437/31, 32, 89, 437/90, 99, 162, 192, 200, 909; 148/DIG. 10, DIG. 11, DIG. 163, DIG. 123, DIG. 124

[56] References Cited

U.S. PATENT DOCUMENTS

| | | | |
|---|---|---|---|
| 4,879,255 | 11/1989 | Degucli et al. | 437/31 |
| 5,106,767 | 4/1992 | Comfort et al. | 437/31 |
| 5,118,634 | 6/1992 | Neudeck et al. | 437/31 |
| 5,234,844 | 8/1993 | Okita | 437/31 |
| 5,250,448 | 10/1993 | Hamasaki et al. | 437/31 |
| 5,272,096 | 12/1993 | De Frésart et al. | 437/100 |
| 5,436,180 | 7/1995 | De Frésart et al. | 467/99 |

FOREIGN PATENT DOCUMENTS

0011738  1/1992  Japan ..................................... 437/100

*Primary Examiner*—Tuan H. Nguyen
*Attorney, Agent, or Firm*—Finnegan, Henderson, Farabow, Garrett & Dunner, L.L.P.

[57] ABSTRACT

An N type diffusion layer as a collector is formed on a P type silicon substrate, and a field oxide film is formed on this diffusion layer. An $MoSi_2$ film is formed on this field oxide film and a first opening is formed on those field oxide film and $MoSi_2$ film to expose the diffusion layer. An N type layer is selectively epitaxially grown only on the bottom of the first opening. A base layer is formed on the N type layer, the side wall of the first opening and the $MoSi_2$ film. The base layer on the N type layer is formed by epitaxial growth, while the base layer on the side wall of the first opening and the $MoSi_2$ film is formed in a polycrystalline state. A first silicon oxide film is formed on this based layer. The first silicon oxide film is thinner on the polycrystalline base layer than on the epitaxially grown base layer. The first silicon oxide film is subjected to anisotropic etching to expose only the surface of the epitaxially grown base layer. An N type silicon film as an emitter is selectively grown only on this exposed base layer.

19 Claims, 5 Drawing Sheets

METHOD OF FABRICATING A BIPOLAR TRANSISTOR OPERABLE AT HIGH SPEED

BACKGROUND OF THE INVENTION

1. Field of the Invention

The present invention relates to a method of fabricating a semiconductor device, and, more particularly, to a method of fabricating a fast bipolar transistor whose base layer is epitaxially grown.

2. Description of the Related Art

Figure 13:
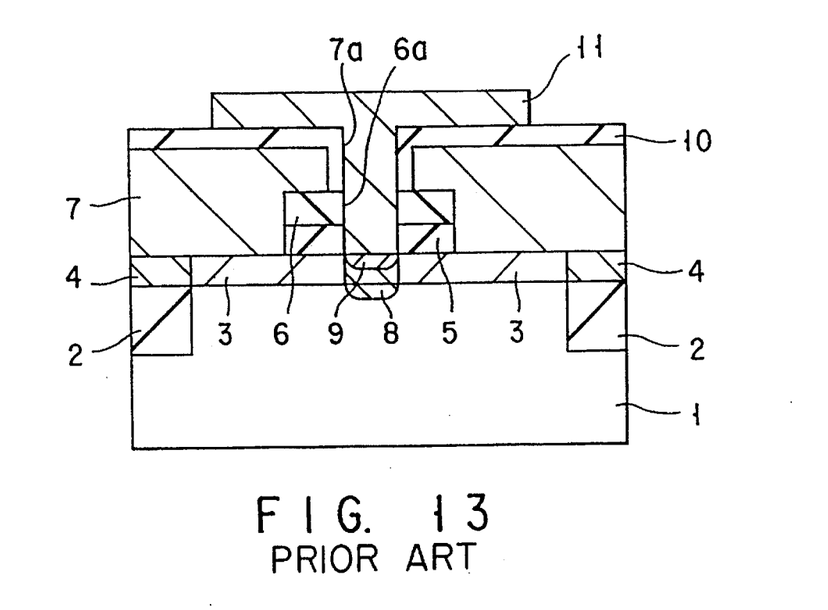
FIG. 13 is a cross-sectional view showing a first conventional method of fabricating a semiconductor device.

In methods of forming the bases of transistors by epitaxial growth, an SEEW (Selective Epitaxy Emitter Window) technique is known as a method of forming the bases and emitters using a selfalign technique. FIG. 13 presents a cross-sectional view for explaining a conventional method of fabricating a semiconductor device, which employs this SEEW technique. The method is disclosed in U.S. application Ser. No. 219,020, filed Jul. 14, 1988.

First, buried oxide films 2 are provide on an $N^-$ type silicon substrate (collector region) 1o Next, an epitaxial layer ($P^{++}$ type base region) 3 is grown on the surface of this $N^-$ type silicon substrate 1, with a first polysilicon layers ($P^{++}$ type base region) 4 grown on the buried oxide films 2. After this step, a silicon oxide film 5 is provided on the epitaxial layer 3 and the first polysilicon layers 4, and a silicon nitride film 6 is formed on this silicon oxide film 5. Then, the silicon nitride film 6 and the silicon oxide film 5 are so etched as to remain only on the epitaxial layer that lies the area between the buried oxide films 2.

After this etching, a second polysilicon layer 7 is deposited on this silicon nitride film 6, epitaxial layer 3 and first polysilicon layers 4. Next, a first opening 7a is formed in the second polysilicon layer 7 above the silicon nitride film 6. Then, a thermal oxide film 10 is formed on the surface of the polysilicon layer 7. A second opening 6a is bored in the silicon nitride film 6 and silicon oxide film 5 under the first opening 7a, thereby exposing a part of the epitaxial layer 3.

A $P^+$ type substantial base region 8 is formed in the epitaxial layer 3 below the second opening 6a. After this step, with the polysilicon layer 7 as a mask, impurity ions are injected in the substantial base region 8 of the epitaxial layer 3 to form an $N^+$ type emitter region 9 below the second opening 6a. A conductive third polysilicon layer 11 is then formed on this emitter region 9 and the thermal oxide film 10.

According to this first conventional method of fabricating a semiconductor device, while the substantial base region 8 and emitter region 9 are formed by the selfaligned technique, the base region 3 is not selfaligned to the buried oxide film 2 which defines the base region 3. Accordingly, the base-collector capacitance increases. Although the emitter width is controlled by using the horizontal selective growth, the reproducibility of the process at this time is generally poor.

Figure 14:
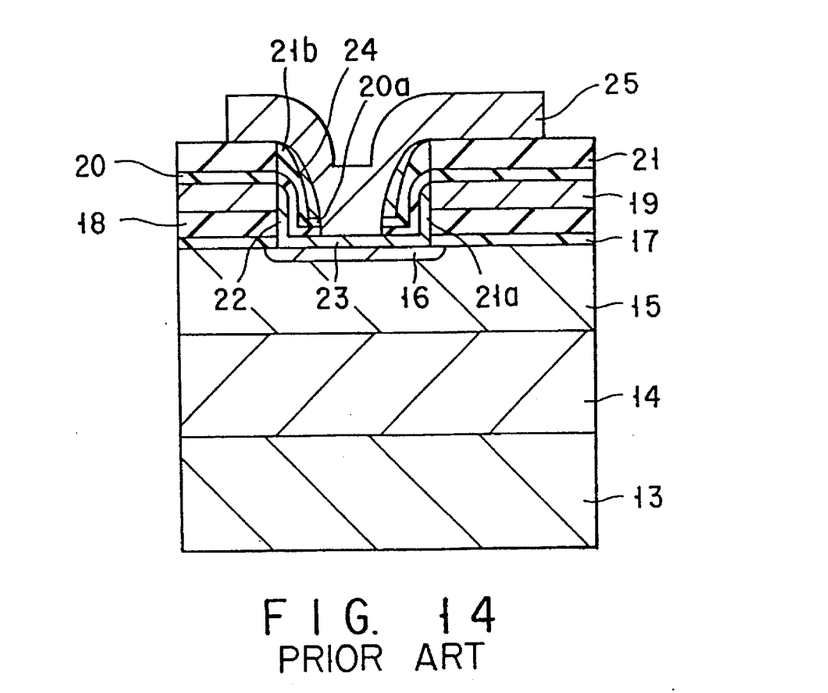
FIG. 14 is a cross-sectional view showing a second conventional method of fabricating a semiconductor device.

FIG. 14 is a cross-sectional view for explaining a second conventional method of fabricating a semi-conductor device. The method is disclosed in U.S. Pat. No. 4,592,933. First, an $N^-$ type diffusion layer 15 for the collector is formed on an $N^+$ type region 14 on a silicon substrate 13. Next, an N type region 16 is formed on the surface of this $N^-$ type diffusion layer 15. Then, a silicon oxide film 17 is deposited on the surface of the silicon substrate 13, and a silicon nitride film 18 is deposited on this silicon oxide film 17. Next, a first polysilicon film 19 for leading out the base is deposited on this silicon nitride film 18, with a first oxide film 20 formed on the first polysilicon film 19. After this step, a first nitride film 21 is formed on this first oxide film 20. Then, an opening 21a is bored in the first nitride film 21, first oxide film 20, first polysilicon film 19, silicon nitride film 18 and silicon oxide film 17 above the N type region 16.

Then, a P type polycrystalline silicon layer 22 is formed on the side wall of this opening 21a where the first polysilicon film 19, silicon nitride film 18 and silicon oxide film 17 are exposed, and a P type epitaxial layer 23 for the base is formed by epitaxial growth on the surface of the N type region 16 which is exposed to the bottom of the opening 21a. Next, a second oxide film 20a is formed on this P type epitaxial layer 23 and the P type silicon layer 22, with a second nitride film 21b formed on this second oxide film 20a. After this step, a second polysilicon film 24 is formed on that portion of the second nitride film 21b which corresponds to the side wall of the opening 21a. With this second polysilicon film 24 used as a mask, the second nitride film 21b and second oxide film 20a are etched to expose a part of the P type epitaxial layer 23. Then, an $N^+$ type polysilicon film 25 for the emitter is formed on this exposed P type epitaxial layer 12, the second polysilicon film 24 and the first nitride film 21.

According to this second conventional semiconductor device fabrication method, the opening 21a is formed in the first nitride film 21, the first oxide film 20, the first polysilicon film 19, the silicon nitride film 18 and the silicon oxide film 17, and the base region 23 and emitter region 25 are formed in a selfaligned manner to the opening 21a. Therefore, the base-emitter capacitance can be made idealistically very small. Because this fabrication method is considerably complicated as is apparent from the above, the control of the manufacturing process is difficult and the manufacturing cost increases.

The semiconductor device fabricated by this method however requires that the base layer should be made thin in order to improve the performance of transistors. In this case, as the base region 23 is made thinner, the P type silicon layer 22 on the side wall of the opening 21a becomes thinner. This increases the resistance of the P type silicon layer 22, thus making it very difficult to stabilize the contact between the base region 23 and the polysilicon film 19 for leading out the base.

SUMMARY OF THE INVENTION

Accordingly, it is a primary object of the present invention to provide a semiconductor device which can reduce the base-emitter capacitance and can reduce the resistance between an external base and internal base even when a base layer is made thinner, thus ensuring a fast transistor operation.

It is another object of this invention to provide a method of fabricating a semiconductor device, which can reduce the base-emitter capacitance and can simplify the fabrication process.

To achieve the above object, according to one aspect of this invention, there is provided a method of fabricating a semiconductor device, comprising the steps of:

forming a first insulating film on a semiconductor substrate of a first conductivity type;

forming an opening in the first insulating film, the opening reaching a surface of the semiconductor substrate;

epitaxially growing a first semiconductor layer of a second conductivity type on a bottom of the opening, and growing the first semiconductor layer of the second conductivity type in a polycrystalline state on a side wall of the opening and the first insulating film;

forming a second insulating film on the first semiconductor layer;

performing anisotropic etching of the second insulating film to remove only the second insulating film on the epitaxially grown first semiconductor layer, thereby exposing a surface of the first semiconductor layer; and selectively growing a second semiconductor layer of the first conductivity type only on the exposed first semiconductor layer.

According to another aspect of this invention, there is provided a semiconductor device comprising:

a semiconductor substrate of a first conductivity type;

a first insulating film formed on the semiconductor substrate;

an opening formed in the first insulating film and reaching a surface of the semiconductor substrate;

a first semiconductor layer of the first conductivity type selectively epitaxially grown only in the opening;

a second semiconductor layer of a second conductivity type epitaxially grown on the first semiconductor layer and grown in a polycrystalline state on a side wall of the opening and the first insulating film;

a second insulating film on the second semiconductor layer while exposing at least a part of the epitaxially grown second semiconductor layer; and a third semiconductor layer of the first conductivity type selectively grown only on the exposed second semiconductor layer.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

One preferred embodiment of the present invention will now be described with reference to the accompanying drawings.

Figure 1:
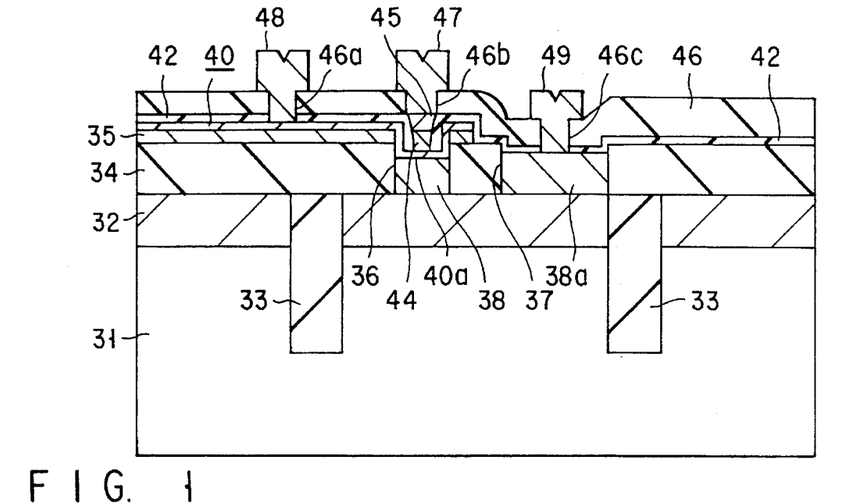
FIG. 1 is a cross-sectional view showing a method of fabricating a semiconductor device according to one embodiment of the present invention and showing the next step to the one shown in FIG. 12.
Figure 2:
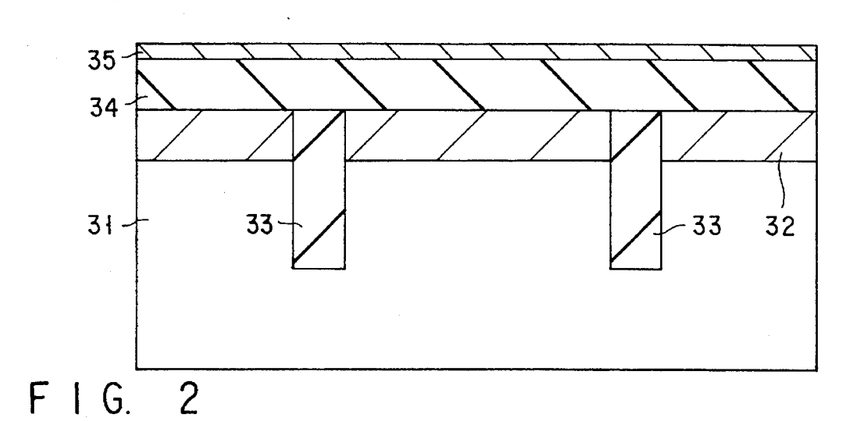
FIG. 2 is a cross-sectional view showing the semiconductor device fabrication method according to this embodiment of this invention.

FIGS. 1 through 12 present cross-sectional views illustrating a step-by-step method of fabricating a semiconductor device according to one embodiment of this invention. First, an $N^+$ type diffusion layer 32 for the buried collector with an impurity concentration of $1 \times 10^{18}$ $cm^{-3}$ is formed on the surface of a P type silicon substrate 31, as shown in FIG. 2. Next, trenches 33 with a device-isolation oxide film buried therein are formed in this P type silicon substrate 31 and the N type diffusion layer 32, after which a field oxide film 34 of $SiO_2$ is formed approximately 700 nm thick on this trenches 33 and the N type diffusion layer 32. Then, an $MoSi_2$ film 35 with a thickness of 250 nm is formed on this field oxide film 34 by sputtering.

Figure 3:
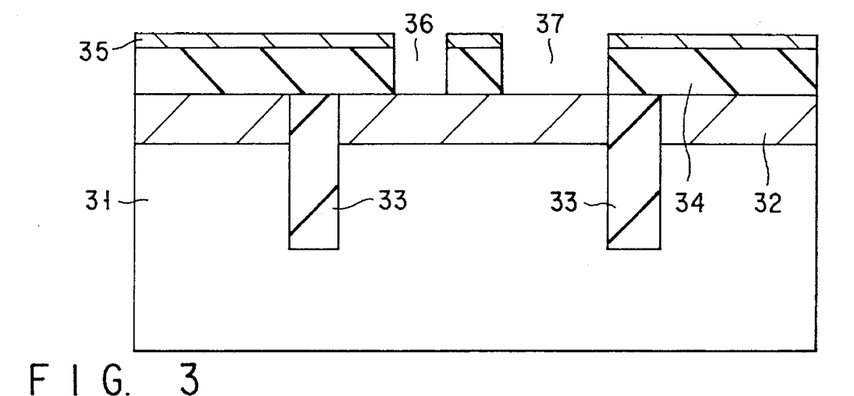
FIG. 3 is a cross-sectional view showing the semiconductor device fabrication method according to this embodiment of this invention and showing the next step to the one shown in FIG. 2.

After the step, as shown in FIG. 3, first and second openings 36 and 37, which reach the surface of the N type diffusion layer 32 (P type silicon substrate 31), are formed in the $MoSi_2$ film 35 and field oxide film 34 by lithography and RIE (Reactive Ion Etching). The first opening 36 has an open width of 1 µm and the second opening 37 has an open width of 2 µm.

Figure 4:
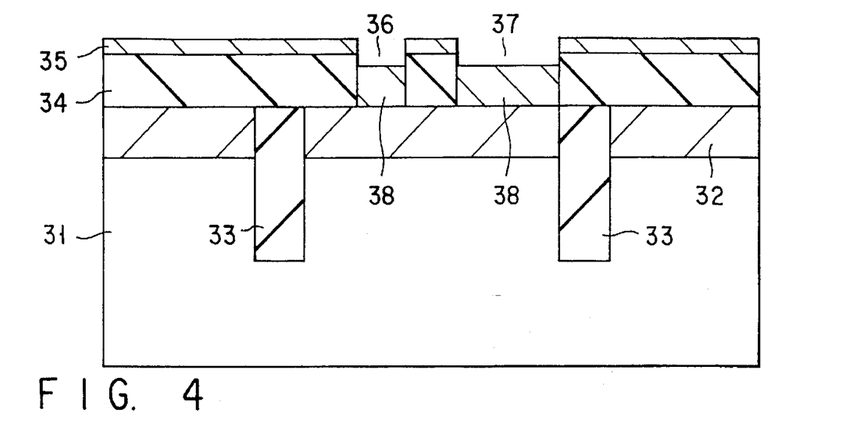
FIG. 4 is a cross-sectional view showing the semiconductor device fabrication method according to this embodiment of this invention and showing the next step to the one shown in FIG. 3.

Next, an N type layer 38 with an impurity concentration of $1 \times 10^{16}$ $cm^{-3}$ and a thickness of approximately 500 nm is formed only in the first and second openings 36 and 37 by selective epitaxial growth, as shown in FIG. 4. While it is desirable that the N type layer 38 has the same thickness as the field oxide film 34, the N type layer 38 may be slightly thinner than the field oxide film 34. The N type layer 38 is made of Si.

Figure 5:
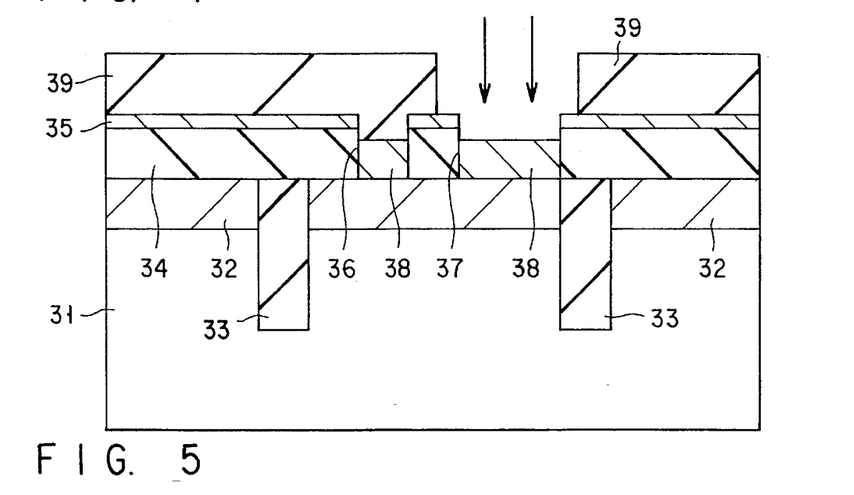
FIG. 5 is a cross-sectional view showing the semiconductor device fabrication method according to this embodiment of this invention and showing the next step to the one shown in FIG. 4.

Then, a first resist pattern 39, which opens the area including the second opening 37, is formed on the $MoSi_2$ film 35 and first opening 36, as shown in FIG. 5. With this first resist pattern 39 used as a mask, phosphorous ions are injected into the N type layer 38 in the second opening 37, so that the impurity concentration of the epitaxial layer 38 in the second opening 37 becomes higher than that in the first opening 36.

Figure 6:
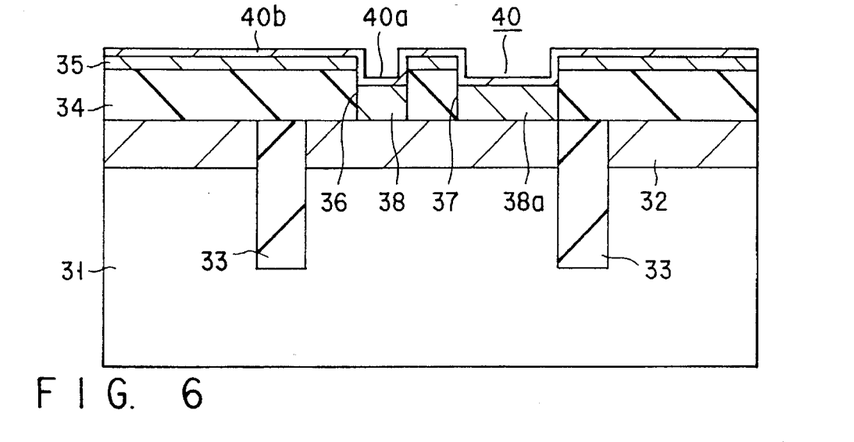
FIG. 6 is a cross-sectional view showing the semiconductor device fabrication method according to this embodiment of this invention and showing the next step to the one shown in FIG. 5.

Next, the P type silicon substrate 31 is annealed after the removal of the first resist pattern 39, as shown in FIG. 6. As a result, an $N^+$ type well 38a for leading out the collector is formed in the second opening 37. Then, an $Si_{0.1}Ge_{0.9}$ layer (base layer) 40 with a boron concentration of $1 \times 10^{18}$ $cm^{-3}$ and a thickness of 50 nm is formed on the $MoSi_2$ film 35 and the first and second openings 36 and 37 (on the entire wafer surface). At this time, an epitaxially grown layer 40a is formed on the N type layer 38 in the first opening 36 and the $N^+$ type well 38a in the second opening 37, and a polycrystalline $Si_{0.1}Ge_{0.9}$ layer 40b is formed on the other portion (on the $MOSi_2$ film 35). The material $Si_{0.1}Ge_{0.9}$ has a narrower forbidden band than Si (N type layer 38).

Figure 7:
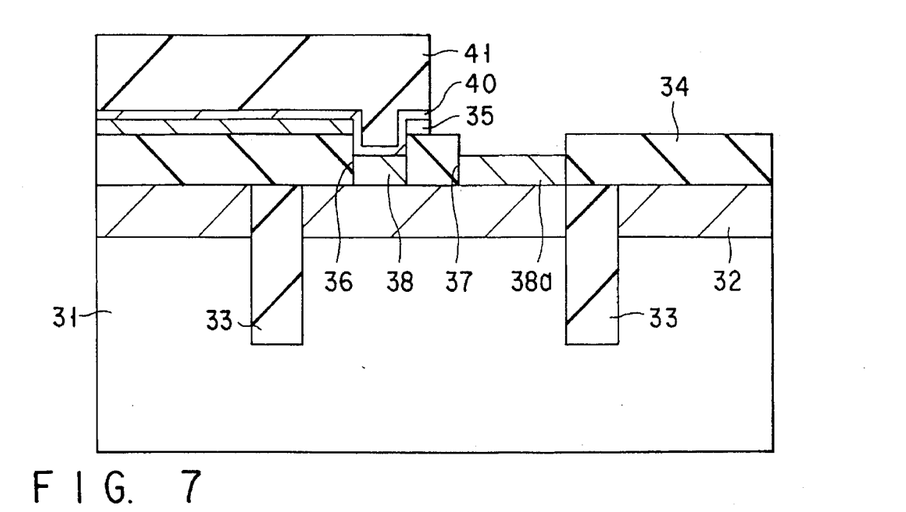
FIG. 7 is a cross-sectional view showing the semiconductor device fabrication method according to this embodiment of this invention and showing the next step to the one shown in FIG. 6.

After the above step, a second resist pattern 41 is formed on a base-electrode lead-out portion which includes the first opening 36, as shown in FIG. 7. With this resist pattern 41 used as a mask, the base layer 40 and $MoSi_2$ film 35 are etched out.

Figure 8:
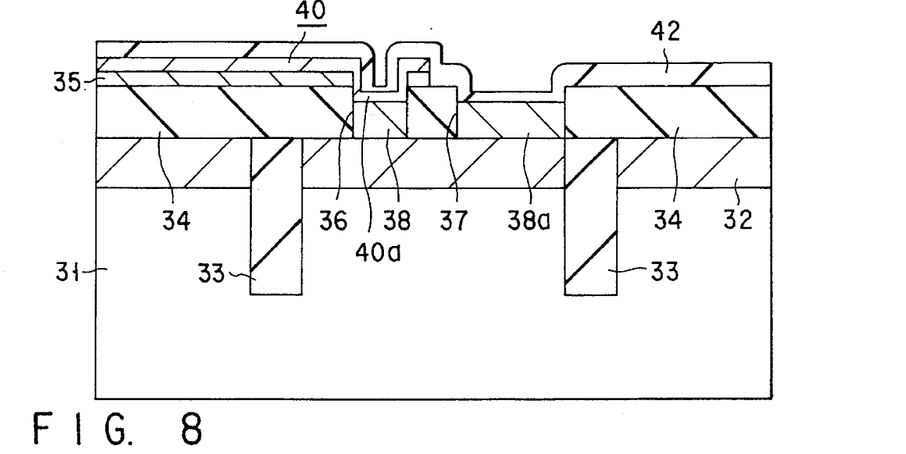
FIG. 8 is a cross-sectional view showing the semiconductor device fabrication method according to this embodiment of this invention and showing the next step to the one shown in FIG. 7.

Then, after the second resist pattern 41 is removed, a first silicon oxide film 42 including boron (B) is deposited 300 nm thick on the base layer 40, field oxide film 34 and $N^+$ type well 38a (on the entire wafer surface), as shown in FIG., 8. The deposition method should be atmospheric pressure CVD or plasma CVD. At this time, the condition such that the covering ratio of the deposited first silicon oxide film 42 becomes low should be selected for the epitaxially grown layer 40 which is located on the bottom side in the first opening 36. That is, since the diameter of the opening 36 is smaller than that of the opening 37, the first silicon oxide film deposited in the opening 36 by the atmospheric pressure CVD or the plasma CVD becomes thinner. Accordingly, the first silicon oxide film 42 located on the epitaxially grown layer 40 in the first opening 36 becomes thinner than the silicon oxide film 40a on the other portion; more specifically, the film 42 becomes approximately 100 nm.

Figure 9:
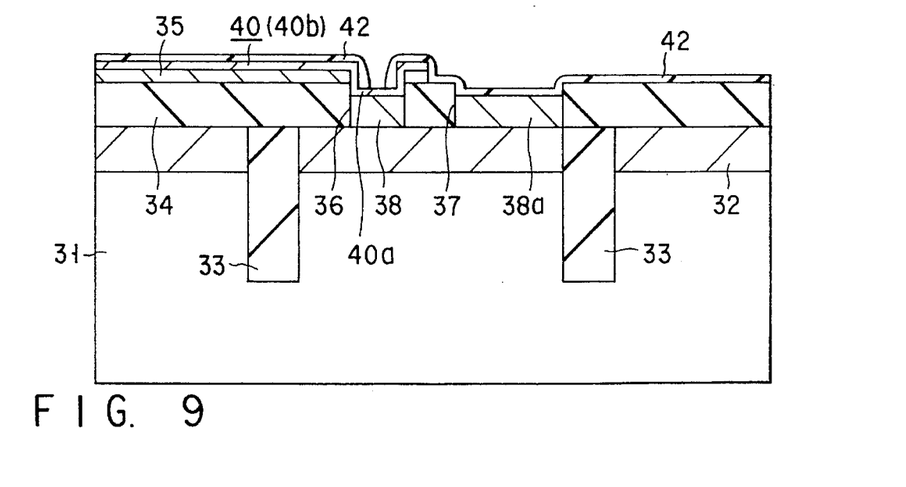
FIG. 9 is a cross-sectional view showing the semiconductor device fabrication method according to this embodiment of this invention and showing the next step to the one shown in FIG. 8.

After this step, the entire surface of the first silicon oxide film 42 is etched using RIE as shown in FIG. 9. At this time, etching is stopped when only a part of the epitaxially grown layer 40a in the first opening 36 is exposed and the first silicon oxide film 42 remains on the other area. Consequently, the first silicon oxide film 42 having a thickness of approximately 150 nm remains on the other area than inside the first opening 36. Next, the first silicon oxide film 42 is subjected to a heat treatment to diffuse boron in the base layer 40. The boron concentration in the base layer 40 then is not constant, and the boron concentration of the $Si_{0.1}Ge_{0.9}$ layer 40b becomes higher than that of the epitaxially grown layer 40a. This is because the impurity diffusion coefficient of the polycrystalline $Si_{0.1}Ge_{0.9}$ layer 40b is greater than that of the single crystalline epitaxially grown layer 40a.

Figure 10:
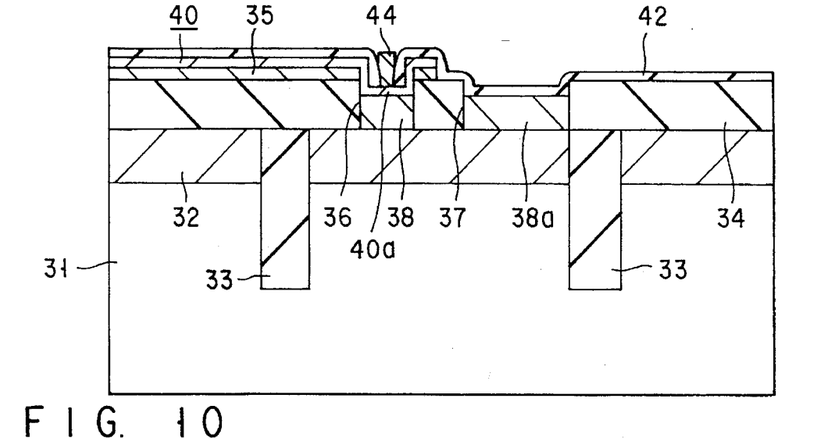
FIG. 10 is a cross-sectional view showing the semiconductor device fabrication method according to this embodiment of this invention and showing the next step to the one shown in FIG. 9.

Next, an N type silicon film 44 with an As concentration of $1 \times 10^{20}$ $cm^{-3}$ is selectively grown only on the portion where the epitaxially grown layer 40a is exposed as shown in FIG. 10. The N type silicon film 44 as the emitter region may be an epitaxially grown film or a polycrystalline film, and may be selected from various types depending on the purpose of the device.

Figure 11:
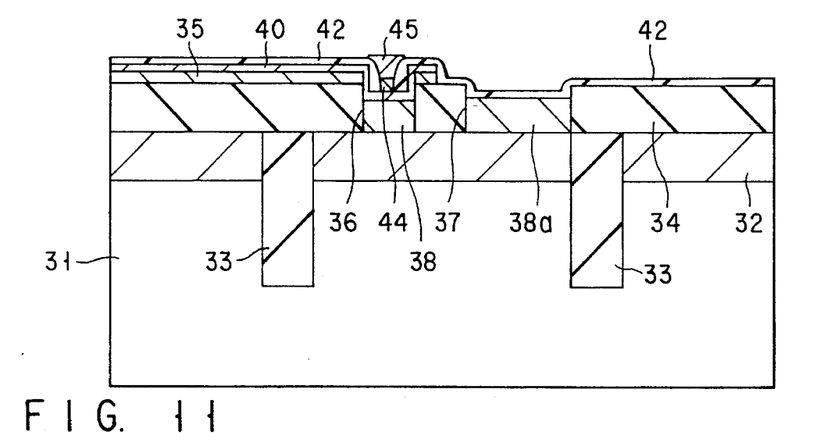
FIG. 11 is a cross-sectional view showing the semiconductor device fabrication method according to this embodiment of this invention and showing the next step to the one shown in FIG. 10.

Then, as shown in FIG. 11, a Ti film with a thickness of 830 nm is formed on the N type silicon film 44 and the first silicon oxide film 42 by sputtering, and a $TiSi_2$ film 45 is selectively formed only on the N type silicon film 44 by a known method.

Figure 12:
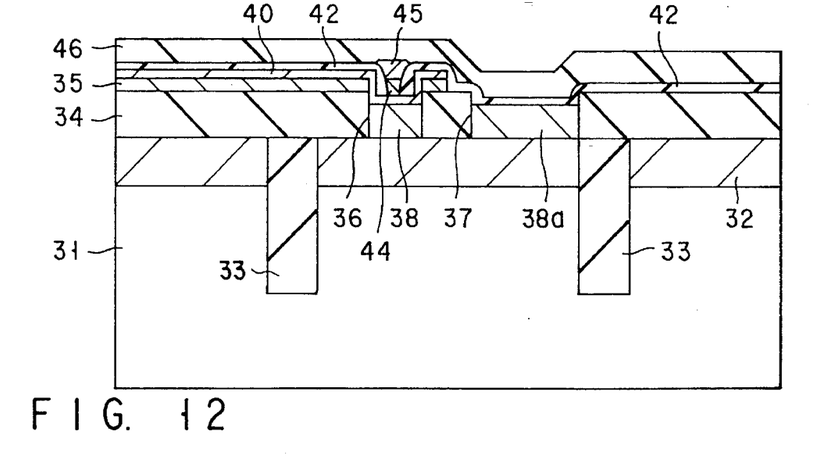
FIG. 12 is a cross-sectional view showing the semiconductor device fabrication method according to this embodiment of this invention and showing the next step to the one shown in FIG. 11.

Then, a second silicon oxide film 46 with a thickness of approximately 400 nm is deposited on the $TiSi_2$ film 45 and the first silicon oxide film 42 by CVD, as shown in FIG. 12.

After the deposition, first to third contact holes 46a to 46c are formed in the first and second silicon oxide films 42 and 46, as shown in FIG. 1. The first contact hole 46a is located over the base layer 40, the second contact hole 46b is located over the $TiSi_2$ film 45, and the third contact hole 46c is located over the $N^+$ type well 38a. Then, an emitter electrode 47 is formed in the second contact hole 46b by an Al inter-connection technique, and is electrically connected via the $TiSi_2$ film 45 to the N type silicon film 44. Also, a base electrode 48 is formed in the first contact hole 46a by the Al interconnection technique, and is electrically connected to the base layer 40. Also, a collector electrode 49 is formed in the third contact hole 46c by the Al interconnection technique, and is electrically connected to the $N^+$ type well 38a. Consequently, a bipolar transistor is completed.

According to this embodiment, the junction between the base layer 40 and the N type layer 38 as the collector region are formed in a selfaligned manner to the first opening 36 on the field oxide film 34. It is therefore possible to reduce the collector-base contact area, thus making the collector-base capacitance significantly smaller. In addition, the N type silicon film 44 which becomes the emitter is likewise formed in a selfaligned manner to the first opening 36, so that the base-emitter contact area can be reduced, thus ensuring a lower base-emitter capacitance.

According to the semiconductor device of this embodiment, even if the base layer 40 located on the side wall of the first opening 36 becomes thinner by making the epitaxially grown layer 40a to be the base thinner, the conventional problems do not arise. More specifically, because the N type layer is formed in the first opening 36 to make the first opening 36 shallower, the base layer 40 located on the side wall of the first opening 36 can be made shorter than the base layer of the prior art. This can suppress the increase in the base resistance, caused by making the base layer 40 located on the side wall of the first opening 36 thinner, better than the prior art. Consequently, even if the base-collector capacitance is made smaller, the resistance between the external base and internal base can be reduced, thus ensuring a faster transistor operation.

Further, a heat treatment is performed after etching the first silicon oxide film 42, thus diffusion boron, contained in the first silicon oxide film 42, into the $Si_{0.1}Ge_{0.9}$ layer 40b on the side wall of the first opening 36. This can reduce the resistance of the $Si_{0.1}Ge_{0.9}$ layer 40b on the side wall of the first opening 36. It is therefore possible to increase the concentration of the impurity (B) of this $Si_{0.1}Ge_{0.9}$ layer 40b to thereby suppress the rise in the base resistance which is caused by the decrease in thickness of the $Si_{0.1}Ge_{0.9}$ layer 40b on the side wall of the first opening 36.

At the time first silicon oxide film 42 is deposited on the base layer 40, field oxide film 34 and $N^+$ type well 38a, the atmospheric pressure CVD or plasma CVD is used as the deposition method. Therefore, the covering ratio of the first silicon oxide film 42 to be deposited on the epitaxially grown layer 40a on the bottom side in the first opening 36 can be made lower than that of the other portion of this oxide film 42. As a result, etching the entire surface of the first silicon oxide film 42 can expose only a part of the epitaxially grown layer 40a in the first opening 36, so that the oxide film 42 remains as the base-emitter isolation spacer on both sides of the exposed portion. It is therefore possible to grow the N type silicon film 44 only on the exposed portion. Thus, the useof this fabrication method can simplify the fabrication process for easier control of the fabrication process and can reduce the manufacturing cost, as compared with the conventional fabrication methods.

Although the N type silicon film 44 is grown only on the portion where the epitaxially grown layer 40a is exposed in the above-described embodiment, an SiC film having a wider forbidden band than an Si layer (N type layer 38) only on the portion where the epitaxially grown layer 40a is exposed.

What is claimed is:

1. A method of fabricating a semiconductor device, comprising the steps of:

forming a first insulating film on a semiconductor substrate of a first conductivity type;

forming an opening in said first insulating film, said opening reaching a surface of said semiconductor substrate;

epitaxially growing a first semiconductor layer of a second conductivity type on a bottom of said opening, and growing said first semiconductor layer of said second conductivity type in a polycrystalline state on a side wall of said opening and said first insulating film;

forming a second insulating film on said first semiconductor layer;

performing anisotropic etching of said second insulating film to remove only said second insulating film on said epitaxially grown first semiconductor layer, thereby exposing a surface of said first semiconductor layer; and selectively growing a second semiconductor layer of said first conductivity type only on said exposed first semiconductor layer.

2. A method according to claim 1, wherein said first semiconductor layer is formed of semiconductor having a narrower forbidden band than said semiconductor substrate.

3. A method according to claim 2, wherein said semiconductor substrate is made of Si, and said first semiconductor layer is made of SiGe.

4. A method according to claim 1, wherein said second semiconductor layer is formed of semiconductor having a wider forbidden band than said semiconductor substrate.

5. A method according to claim 4, wherein said semiconductor substrate is made of Si, and said second semiconductor layer is made of SiC.

6. A method according to claim 1, wherein said second insulating film is a silicon oxide film containing an impurity of said second conductivity type, and said method further includes a step of performing a heat treatment after said step of performing anisotropic etching of said second insulating film.

7. A method of fabricating a semiconductor device, comprising the steps of:

forming a first insulating film on a semiconductor substrate of a first conductivity type;

forming a conductive layer on said first insulating film;

forming an opening in said first insulating film and said conductive layer, said opening reaching a surface of said semiconductor substrate;

epitaxially growing a first semiconductor layer of a second conductivity type on a bottom of said opening, and growing said first semiconductor layer of said second conductivity type in a polycrystalline state on a side wall of said opening and said conductive layer;

forming a second insulating film on said conductive layer, said second insulating film being thinner on said epitaxially grown first semiconductor layer than on said first semiconductor layer grown in said polycrystalline state;

performing anisotropic etching of said second insulating film to remove only said second insulating film on said epitaxially grown first semiconductor layer, thereby exposing a surface of said first semiconductor layer; and selectively growing a second semiconductor layer of said first conductivity type only on said exposed first semiconductor layer.

8. A method according to claim 7, wherein said first semiconductor layer is formed of semiconductor having a narrower forbidden band than said semiconductor substrate.

9. A method according to claim 8, wherein said semiconductor substrate is made of Si, and said first semiconductor layer is made of SiGe.

10. A method according to claim 9, wherein said second semiconductor layer is formed of semiconductor having a wider forbidden band than said semiconductor substrate.

11. A method according to claim 10, wherein said semiconductor substrate is made of Si, and said second semiconductor layer is made of SiC.

12. A method according to claim 7, wherein said second insulating film is a silicon oxide film containing an impurity of said second conductivity type, and said method further includes a step of performing a heat treatment after said step of performing anisotropic etching of said second insulating film.

13. A method of fabricating a semiconductor device, comprising the steps of:

forming a first insulating film on a semiconductor substrate of a first conductivity type;

forming a conductive layer on said first insulating film;

forming an opening in said first insulating film and said conductive layer, said opening reaching a surface of said semiconductor substrate;

selectively epitaxially growing a first semiconductor layer of said first conductivity type only in said opening;

epitaxially growing a second semiconductor layer of a second conductivity type on said first semiconductor layer, and growing said second semiconductor layer of said second conductivity type in a polycrystalline state on a side wall of said opening and said conductive layer;

forming a second insulating film on said second semiconductor layer, said second insulating film being thinner on said epitaxially grown second semiconductor layer than on said second semiconductor layer grown in said polycrystalline state;

performing anisotropic etching of said second insulating film to remove only said second insulating film on said epitaxially grown second semiconductor layer, thereby exposing a surface of said second semiconductor layer; and selectively growing a third semiconductor layer of said first conductivity type only on said exposed second semiconductor layer.

14. A method according to claim 13, wherein said second semiconductor layer is formed of semiconductor having a narrower forbidden band than said first semiconductor layer.

15. A method according to claim 14, wherein said first semiconductor layer is made of Si, and said second semiconductor layer is made of SiGe.

16. A method according to claim 13, wherein said third semiconductor layer is formed of semiconductor having a wider forbidden band than said first semiconductor layer.

17. A method according to claim 16, wherein said first semiconductor layer is made of Si, and said third semiconductor layer is made of SiC.

18. A method according to claim 13, wherein said second insulating film is a silicon oxide film containing an impurity of said second conductivity type, and said method further includes a step of performing a heat treatment after said step of performing anisotropic etching of said second insulating film.

19. A method of fabricating a bipolar transistor, comprising the steps of:

forming a first semiconductor layer of a second conductivity type as a collector region in a semiconductor substrate of a first conductivity type;

forming a first insulating film as a field oxide film on said first semiconductor layer;

forming a conductive layer on said first insulating film;

forming first and second openings in said first insulating film and said conductive layer, said openings reaching a surface of said first semiconductor layer;

selectively epitaxially growing a second semiconductor layer of a second conductivity type on bottoms of said first and second openings, said second semiconductor layer in said second opening being a collector-electrode lead-out portion;

forming a third semiconductor layer of said first conductivity type on said second semiconductor layer in said first opening, a side wall of said first opening and said conductive layer, said third semiconductor layer as a base region located on said second semiconductor layer being formed by epitaxial growth, said third semiconductor layer on said side wall of said first opening and said conductive layer being formed in a polycrystalline state;

forming a second insulating film on said third semiconductor layer, said second insulating film being thinner on said epitaxially grown third semiconductor layer than on said third semiconductor layer grown in said polycrystalline state;

performing anisotropic etching of said second insulating film to remove a part of said second insulating film on said epitaxially grown third semiconductor layer, thereby exposing a surface of said epitaxially grown third semiconductor layer; and selectively growing a fourth semiconductor layer of said first conductivity type as an emitter region only on said exposed third semiconductor layer.

* * * * *